United States Patent
Grewing et al.

(10) Patent No.: US 7,154,347 B2
(45) Date of Patent: *Dec. 26, 2006

(54) COMPENSATING METHOD FOR A PLL CIRCUIT THAT FUNCTIONS ACCORDING TO THE TWO-POINT PRINCIPLE, AND PLL CIRCUIT PROVIDED WITH A COMPENSATING DEVICE

(75) Inventors: Christian Grewing, Düsseldorf (DE); Markus Hammes, Dinslaken (DE); André Hanke, Düsseldorf (DE); Giuseppe Li Puma, Bochum (DE)

(73) Assignee: Infineon Technologies AG, Munich (DE)

( * ) Notice: Subject to any disclaimer, the term of this patent is extended or adjusted under 35 U.S.C. 154(b) by 54 days.

This patent is subject to a terminal disclaimer.

(21) Appl. No.: 10/490,604

(22) PCT Filed: Jul. 24, 2002

(86) PCT No.: PCT/DE02/02709

§ 371 (c)(1),
(2), (4) Date: Oct. 18, 2004

(87) PCT Pub. No.: WO03/032493

PCT Pub. Date: Apr. 17, 2003

(65) Prior Publication Data
US 2005/0046488 A1    Mar. 3, 2005

(30) Foreign Application Priority Data
Sep. 28, 2001    (DE) .............................. 101 47 963

(51) Int. Cl.
*H03L 7/00* (2006.01)

(52) U.S. Cl. .................. 331/23; 331/44; 332/127; 332/128

(58) Field of Classification Search ............... 331/23, 331/44; 332/127, 128
See application file for complete search history.

(56) References Cited

U.S. PATENT DOCUMENTS 4,965,531 A    10/1990    Riley (Continued)

FOREIGN PATENT DOCUMENTS

DE    199 29 167 A1    12/2000

(Continued)

OTHER PUBLICATIONS

International Search Report for International Application No. PCT/DE02/02709, International Filing Date Jul. 24, 2002, 3 pgs.

*Primary Examiner*—Joseph Chang
(74) *Attorney, Agent, or Firm*—Eschweiler & Associates, LLC

(57) ABSTRACT

A PLL circuit is tuned to a first frequency by using a first digital modulation signal and subsequently tuned to a second frequency by using a second digital modulation signal. A differential signal, that is a function of the change in voltage of a VCO control signal generated by the modulation signals, is compared with a comparison signal, that is characteristic of the analog modulation amplitude. Based on the comparison the analog modulation amplitude is changed to minimize or substantially eliminate a deviation between the signals.

17 Claims, 2 Drawing Sheets

U.S. PATENT DOCUMENTS

| | | |
|---|---|---|
| 5,027,087 A | 6/1991 | Rottinghaus |
| 5,483,203 A | 1/1996 | Rottinghaus |
| 5,983,077 A | 11/1999 | Dent |
| 6,008,703 A | 12/1999 | Perrott et al. |
| 6,034,573 A | 3/2000 | Alderton |
| 6,044,124 A | 3/2000 | Monahan et al. |
| 6,933,798 B1 * | 8/2005 | Hammes et al. ............ 332/127 |
| 2002/0180548 A1 * | 12/2002 | Mattisson et al. .......... 332/127 |
| 2005/0084034 A1 * | 4/2005 | Hammes et al. ............ 375/295 |

FOREIGN PATENT DOCUMENTS

| | | |
|---|---|---|
| EP | 0 961 412 A1 | 12/1999 |
| WO | WO 99/07065 A1 | 2/1999 |

* cited by examiner

COMPENSATING METHOD FOR A PLL CIRCUIT THAT FUNCTIONS ACCORDING TO THE TWO-POINT PRINCIPLE, AND PLL CIRCUIT PROVIDED WITH A COMPENSATING DEVICE

RELATED APPLICATION

This application is a National Stage filing of International Application No. PCT/DE02/02709, filed Jul. 24, 2002, which is entitled "Compensating method for a PLL circuit that functions according to the two-point principle, and PLL circuit provided with a compensating device", which was not published in English, that claims priority to German Patent Application No. 101 47 963.8 filed on Sep. 28, 2001, and both are hereby incorporated by reference in their entirety.

FIELD OF THE INVENTION

The invention relates to a compensating method for a PLL circuit that functions according to the two-point principle and to a PLL circuit designed according to the principle of two-point modulation and provided with a compensating device.

BACKGROUND OF THE INVENTION

A transmitter concept that can be implemented with little complexity for transceivers in mobile radio systems is offered by transmitters which have a modulator that functions according to the known principle of two-point modulation. A PLL (Phase Locked Loop=follow-up synchronization) circuit is used in this case as a frequency synthesizer, and is used for the phase or frequency modulation of a high-frequency signal.

The modulation signal is usually injected into the PLL circuit via a programmable frequency divider contained in the feedback path of the PLL loop. A digital modulation signal is used in this case, and is used for continually reprogramming the digital frequency divider. This form of modulation, which is also referred to as single-point modulation, is known for example from the Patent Specifications U.S. Pat. No. 4,965,531, U.S. Pat. No. 6,008,703 and U.S. Pat. No. 6,044,124.

To achieve low noise of the PLL circuit, the bandwidth of the circuit is made much smaller than is required for the transmission of the modulated data. Therefore, in addition to the purely digital modulation, an analog modulation is also used to compensate for the restricted bandwidth. The simultaneous injection of a digital modulation signal and an analog modulation signal into a PLL circuit is referred to as two-point modulation.

The injection of the digital and analog modulation signals takes place at two different points of the PLL circuit. What is important for the way in which the two-point modulation operates is that, apart from being synchronized in phase, a high degree of coincidence of the amplitudes of the two modulation signals used is required. However, on account of production tolerances of the components for the analog modulation, fluctuations occur in the modulation gradient and the amplitude level of the modulation. For this reason, it is necessary to perform an amplitude compensation between the analog modulation signal and the digital modulation signal once the PLL circuit has been produced.

If temperature influences additionally have to be taken into account, such a compensation has to be carried out before each transmitting operation.

A two-point modulator and a method for phase and frequency modulation with a PLL circuit is described in the German Laid-open Patent Application DE 199 29 167 A1. The modulation in this case takes place in the first instance at a point of the PLL circuit at which high-pass transmission characteristics are obtained for the modulation frequency. In addition, the modulation takes place at a second point of the PLL circuit, at which low-pass transmission characteristics are obtained for the modulation frequency. The modulation with low-pass transmission characteristics takes place digitally in a frequency divider in the feedback path of the PLL circuit.

A know method for compensating a PLL circuit with two-point modulation comprises impressing the two-point modulation of the circuit in the steady state and using an external measuring receiver to receive and demodulate the signal that is sent. Depending on the demodulation result obtained, a compensation of the digital and analog modulation signals is performed. However, on account of the non-linear behavior of the oscillation-generating element—of a voltage-controlled oscillator VCO—of the PLL circuit with regard to the frequency as a function of the control voltage, this compensation must be performed for each channel. For a relatively large number of channels, this results in a correspondingly long measuring time. In addition, the compensation information must be stored in a memory. It can be regarded as a further disadvantage that the influence of temperature changes is not taken into account in this method.

The receiving and demodulating of the signal generated by the PLL circuit can also be performed by the receiving part of the transceiver. However, this increases the complexity of the circuitry in a disadvantageous way, since this would require a complete second PLL circuit in the receiver.

In the document WO 99/07065 there is a description of a compensating method for a PLL that functions according to the principle of two-point modulation. In this method, the PLL is tuned to different frequencies by specifying different divider values N, and the corresponding voltage values at the input of the VCO are recorded. The pairs of values determined in this way are used to calculate the characteristic of the VCO. The characteristic is evaluated by means of a processor, and scaling values for setting the modulation amplitude of the analog modulation signal are thereby determined.

SUMMARY OF THE INVENTION

The object of the invention is to provide a compensating method for a PLL circuit with which rapid and exact amplitude compensation can be achieved between the digital modulation signal and the analog modulation signal. Furthermore, the invention aims at providing a PLL circuit with a compensating device, in which a rapid and exact amplitude compensation of the modulation signals can be achieved with a relatively simple circuit arrangement.

In the case of a compensating method for a PLL circuit that functions according to the principle of two-point modulation, the PLL circuit is tuned to a first frequency by injecting a first digital modulation signal. Subsequently, a second digital modulation signal is injected into the PLL circuit, the PLL circuit being tuned to a second frequency, which deviates from the first frequency. A differential signal, which is characteristic of the change of a control signal of a frequency-generating unit of the PLL circuit that is brought about by the two digital modulation signals, is generated and coupled out from the PLL circuit. The differential signal is compared with a comparison signal, which is characteristic of a modulation amplitude of an analog modulation signal, and, dependent on the deviation that is determined in the comparison, the modulation amplitude is changed to eliminate the deviation.

This allows the effect be achieved in the compensating method according to the invention that the demodulating of the output signal generated by the PLL circuit for compensating purposes is no longer required, since compensating relies on a deviation between two digital modulation signals that is represented by a differential signal which is characteristic of the deviation. Furthermore, this allows the effect to be achieved that a relatively exact and rapid compensation can be carried out.

An advantageous exemplary embodiment of the compensating method according to the invention is characterized in that the first digital modulation signal is injected in such a way that the PLL circuit is tuned to a first frequency, which is formed by subtracting a frequency of a variably selectable, digital modulation amplitude from a channel center frequency. If the injection of the second digital modulation signal then causes the PLL circuit to be tuned to a second frequency, which is formed by adding the frequency of the variably selectable, digital modulation amplitude and the channel center frequency, a preferred variant of the configuration is characterized in that a voltage value corresponding to the analog modulation signal is multiplied by a factor of 2 for the comparison with the voltage value corresponding to the differential signal. This allows the effect be achieved that an analog voltage value corresponding to the differential signal can be relatively high and, as a result, deviations between the digital modulation and the analog modulation can be compensated relatively exactly.

According to a preferred design, a compensating path contributing to the control signal generation is connected in parallel with a main path of the PLL circuit. In this case, an advantageous variant of the method is characterized in that the compensating path is activated at least during the injection of the second digital modulation signal.

Furthermore, it may be provided in an advantageous way that the main path of the PLL circuit is deactivated after the injection of the first digital modulation signal, in that a current generated by a first charge pump in the main path is set to the value of zero. This achieves the effect that a voltage corresponding to the first digital modulation signal at a tuning input of a VCO remains substantially constant during the steps which follow (second injection step and, if appropriate, compensating step).

However, maintaining the voltage generated during the first injection step at the tuning input of the VCO can generally also be accomplished in a different way. A advantageous exemplary embodiment is zed in that the main path of the PLL circuit is kept active after the injection of the first digital modulation signal and a current is set by the charge pump in the main path of the PLL circuit in such a way that the voltage at the tuning input of the VCO is kept substantially constant. This can achieve the effect that changing of the voltage (generated during the first injection step) at the tuning input of the VCO on account of leakage currents in the main path is prevented during the compensation.

A further aspect of the invention relates to a PLL circuit which is formed for the injection of an analog modulation signal and a digital modulation signal according to the principle of two-point modulation. Connected in parallel with a main path of the PLL circuit is a compensating path, which comprises a coupling-out means for generating a differential signal, which is characteristic of the change of a control signal of a frequency-generating unit when different digital modulation signals are injected into the PLL circuit. Furthermore, the compensating path comprises a comparison unit for comparing the differential signal with a comparison signal, which is characteristic of a modulation amplitude of an analog modulation signal, and a modulation unit, which changes the modulation amplitude in dependence on an output signal of the comparison unit.

The PLL circuit according to the invention, with the main path and the compensating path connected in parallel, provides a relatively simple and low-complexity circuit arrangement, with which a rapid and exact compensation of the digital modulation signal and the analog modulation signal can be carried out.

In the case of an advantageous exemplary embodiment, it may be provided that the differential signal can be applied by means of a first switch to a modulation input of a VCO of the PLL circuit. Furthermore, it may be provided that the compensating path has a second switch, in the closed position of which the compensation signal is present at an input of the comparison unit.

BRIEF DESCRIPTION OF THE DRAWINGS

The invention is explained in more detail below on the basis of an exemplary embodiment with reference to the drawing, in which.

DETAILED DESCRIPTION OF THE INVENTION

Figure 1:
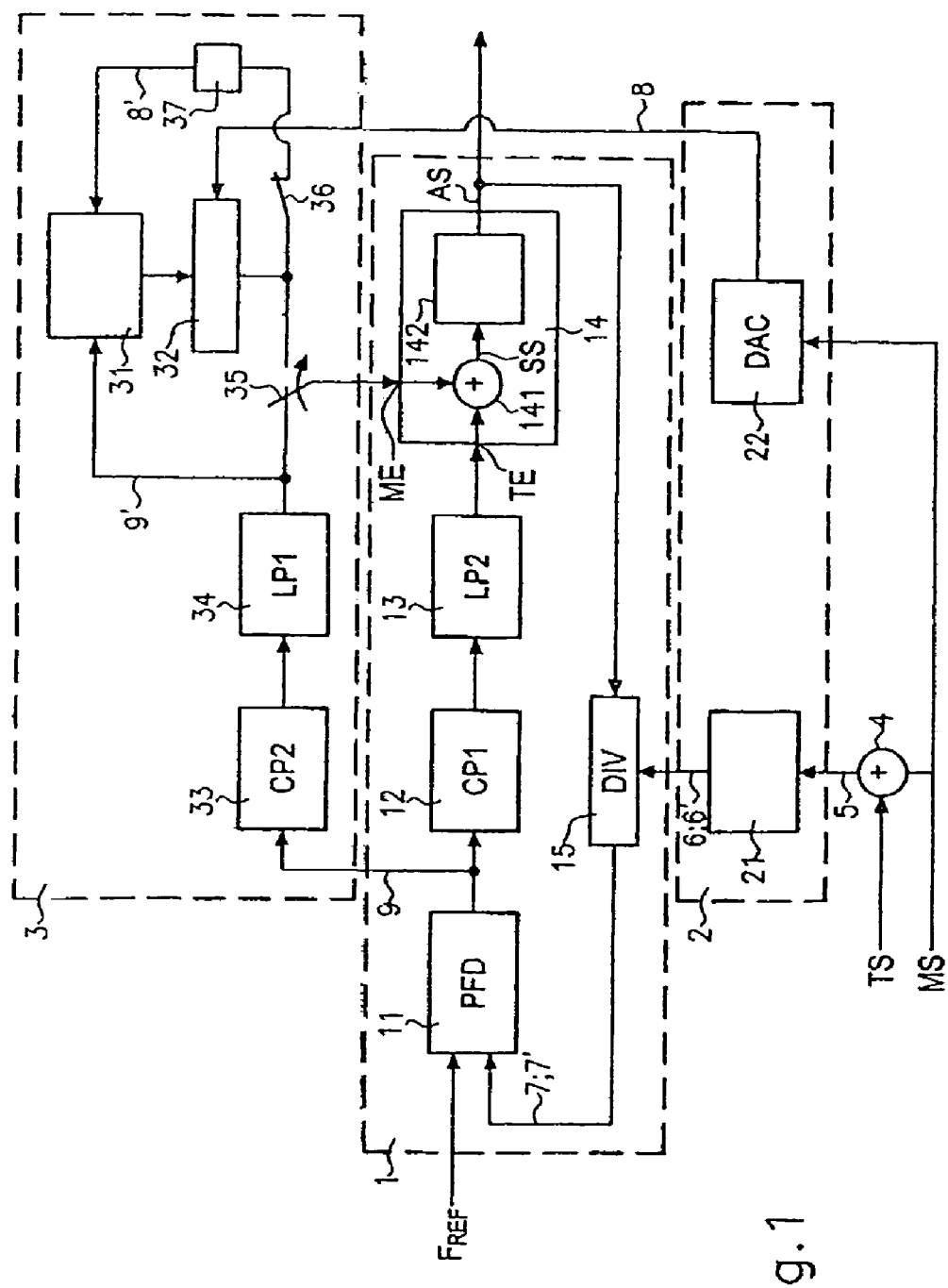
FIG. 1 shows a block diagram of a PLL circuit according to the invention with a compensating device.

A PLL circuit 1 (FIG. 1) that functions according to the principle of two-point modulation is electrically connected to a modulation device 2 and a compensating path 3. The PLL circuit 1 has in its main path a phase detector (PFD=Phase Frequency Detector) 11, a first charge pump (CP1=Charge Pump 1) 12, a first loop filter (LP1=Loop Filter 1) 13 and a voltage-controlled oscillator (VCO=Voltage Controlled Oscillator) 14. The loop filter 13 is configured as a low-pass filter, whereby higher-frequency signal components are smoothed. The VCO 14 represents the oscillation-generating component in the PLL circuit 1 and has a summation point 141 and a frequency-generating unit 142. The PLL circuit 1 is closed by means of a feedback path, which extends from the output of the VCO 14 to an input of the PFD 11 and in which a programmable frequency divider (DIV=Divider) 15 is arranged. The DIV 15 may be configured for example as a fractional–N frequency divider, whereby a frequency division by a non-integral number is also made possible.

For the preprocessing of a modulation signal MS, the modulation device 2 has a programming unit 21 and a digital/analog converter (DAC=Digital Analog Converter) 22.

Connected in parallel with the main path of the PLL circuit 1 is the compensating path 3. The compensating path 3 has a second charge pump (CP2) 33 and a second loop filter (LP2) connected downstream of the charge pump 33. Furthermore, a comparison unit 31 and an analog modulation unit 32 are arranged in the compensating path 3. Depending on the compensating operation carried out, the comparison unit 31 and the analog modulation unit 32 are electrically connected by means of a first switch 35 to a modulation input ME of the VCO 14 of the PLL circuit 1. By means of a second switch 36, the output of the analog modulation unit 32 can be fed back to a second input of the comparison unit 31. This signal path between the modulation unit 32 and the comparison unit 31 also has a multiplier 37.

In the two-point modulation, an analog modulation signal and a digital modulation signal are impressed on the PLL circuit 1 via the modulation device 2. Since the analog modulation signal is affected by drift and tolerances, by contrast with the digital modulation signal which does not have any tolerances on account of its discrete nature, it is necessary to compensate the two modulation signals with regard to their amplitudes.

A modulation signal MS, which in the exemplary embodiment is given the form of a digital signal, is added at a summation point 4 to a carrier signal TS on which the PLL frequency synthesis is based. The resulting signal 5 is present at an input of the programming unit 21.

The programming unit 21, which in the exemplary embodiment is configured as a sigma-delta modulator, generates at its output a first digital modulation signal 6, which is present at a second input of the DIV 15. The digital modulation signal 6 in this case specifies a divider ratio of $1:N_1$, where $N_1$ is an integral number. As a result, the modulation signal MS is injected with a (variable) frequency dividing ratio, determined by the modulation, via the DIV 15 into the feedback path. A first frequency division signal 7, which is present at the first input of the PFD 11, is generated at the output of the DIV 15.

At a second input of the PFD 11 there is a reference signal with a corresponding reference frequency $F_{REF}$. The reference frequency $F_{REF}$ may be generated for example by an oscillator crystal, which is not represented. As a result, a signal which is characteristic of the difference in frequency and/or phase between the reference signal and the first frequency division signal 7 is generated at the output of the PFD 11. This output signal 9 of the PFD 11 is used for driving the charge pump 12. A current which is dependent on the signal 9 with which the charge pump 12 is driven is generated in the charge pump 12. With the current generated in the charge pump 12, the loop filter 13 is charged. The output signal of the loop filter 13 is a voltage signal and is present at the tuning input TE of the VCO 14.

An output signal AS, which is present at the first input of the DIV 15 and is modulated by the first digital modulation signal 6, is generated at the output of the VCO 14.

The compensating method is explained below on the basis of the PLL circuit according to FIG. 1:

In a first step, the first digital modulation signal 6, with a first constant divider ratio of $1:N_1$, is entered. The divider ratio $1:N_1$ is such that the PLL circuit 1 is tuned to a first frequency $F_1$, which corresponds to a channel center frequency f less a digital modulation amplitude $\Delta f_{Dig}$.

Tuning the PLL circuit 1 to the frequency $F_1=f-\Delta f_{Dig}$ produces at the tuning input TE of the VCO 14 a voltage value $V_1$ which corresponds to this frequency $F_1$, for example in the case of a linear frequency voltage characteristic of the VCO 14 is proportional to this frequency $F_1$.

During this tuning of the PLL circuit 1 to the frequency $F_1$, the compensating path 3 is deactivated, the second loop filter (LP2) 34 being pre-charged to the fixed voltage value of zero. The switches 35 and 36 are in the positions represented in FIG. 1, which in the case of both switches 35 and 36 are referred to as closed.

Once the tuning of the PLL circuit 1 to the frequency $F_1$ has been completed, the main path of the PLL circuit 1 is deactivated in a second step, in that the current from the charge pump 12 is set to the fixed value of zero and the control loop is consequently opened. In the process it is ensured by the integral action of the loop filter 13 that the voltage $V_1$ at the tuning input TE of the VCO 14 or at a summation point 141 remains virtually unchanged. This applies at least for the duration of the subsequent compensating operation. Furthermore, the compensating path 3, that is to say the second charge pump 33 and the second loop filter 34, is then activated and, as a result, the control loop is closed by means of the compensating path 3.

The switch position of the two switches 35 and 36 thereby remains unchanged.

Subsequently, the programming unit 21 is reprogrammed, so that a second digital modulation signal 6', which indicates a second constant divider ratio $1:N_2$, is generated at the output of the programming unit 21.

The second divider ratio $1:N_2$ is set in such a way that the output signal AS at the VCO 14 has a second frequency $F_2=f+\Delta f_{Dig}$. The PLL circuit is consequently tuned to the second frequency $F_2$. Since the voltage value $V_1$ is still present at the tuning input TE, a voltage value $V_2$ that corresponds to twice the digital modulation amplitude $2\Delta f_{Dig}$ is produced at the modulation input ME of the VCO 14.

This voltage value $V_2$ results from the fact that the output frequency at the VCO 14 corresponds to the second frequency $F_2$, to which the PLL circuit 1 is tuned. Therefore, at the frequency-generating unit 142 there is a control signal SS, the voltage $V_3$ of which generates this frequency $F_2$. On account of the summation condition at the summation point 141 and the fixed voltage $V_1$ at the tuning input TE, a voltage value of $V_2(2\Delta f_{Dig})=V_3(f+\Delta f_{Dig})-V_1(f-\Delta f_{Dig})$ is therefore obtained at the modulation input ME.

For comparing the differential signal 9' at the output of the second low-pass filter 34 with an analog modulation signal, in a third step the modulation signal MS is converted by the DAC 22 into an analog modulation signal 8 and is present at a second input of the analog modulation unit 32. The analog modulation signal 8 brings about a frequency $F_3=f+\Delta f_{Ana}$ at the output of the VCO. In the compensated state, the voltage value corresponding to this frequency $F_3$ at the modulation input ME must be half the voltage value $V_2$. For comparing with the voltage value $V_2$, this voltage value is picked off at the output of the modulation unit 32 and, after doubling in the multiplier 37, is applied as a comparison signal 8' to a second input of the comparison unit 31.

The voltage value $V_2$ of the differential signal 9' is at the same time present at a first input of the comparison unit 31, which in the exemplary embodiment is configured as a comparator. The switch positions remain unchanged, that is to say the comparison unit 31 and the analog modulation unit 32 are decoupled from the modulation input ME of the VCO 14 by the switch position of the first switch 35.

A deviation between the voltage value $V_2$ of the differential signal 9' and the corresponding voltage value of the comparison signal 8' that is determined in the comparison unit 31 is eliminated, in that the modulation amplitude of the analog modulation signal provided at the output of the analog modulation unit 32 is changed.

Alternatively, the voltage $V_2$ at the input of the comparison unit 31, corresponding to the differential signal 9', may be stored, for example by a capacitor, and subsequently compared with the voltage value of the comparison signal 8'.

Once the compensating operation has been completed, the switch 35 is switched over, the switch 36 is opened and the charge pump 33 and the loop filter 34 are deactivated. The main path of the PLL circuit 1 is activated.

The PLL circuit 1 for the two-point modulation is then compensated and can commence its operation. The digital modulation signal and the analog modulation signal in this case superposed, and frequency-independent transmission characteristics of the PLL circuit 1 are obtained as a result of the compensating operation described.

The generating of the comparison signal 8' may also be carried out in the comparison unit 21 or in the analog modulation unit 32.

If an analog signal is used as the modulation signal MS, the modulation device 2 may also be configured for example in such a way that the DAC 22 is not required, but instead a corresponding signal conversion is carried out in the digital modulation path.

The compensating of the signals applied to the comparison unit 31 may be performed for example in an iterative process. In this case, an approximative compensation of the modulation amplitudes with alternate updating of the comparison signal 8' and assessment of the changed output signal then obtained from the comparison unit 31 takes place. When the difference in voltage has been eliminated at the comparison unit 31, the compensation between the digital modulation amplitude and the analog modulation amplitude is achieved.

It may also be provided that, during the compensation, the main path of the PLL circuit 1 is kept active, in that the first charge pump 12 is operated with a small current. On account of the reduced current of the first charge pump 12, the main path of the PLL circuit 1 cannot follow the modulation and the voltage at the tuning input TE of the VCO 14 remains constant. This allows the effect to be achieved that a voltage loss at the tuning input TE of the VCO 14 caused by leakage currents which may occur in the case of a deactivated main path are compensated.

Figure 2:
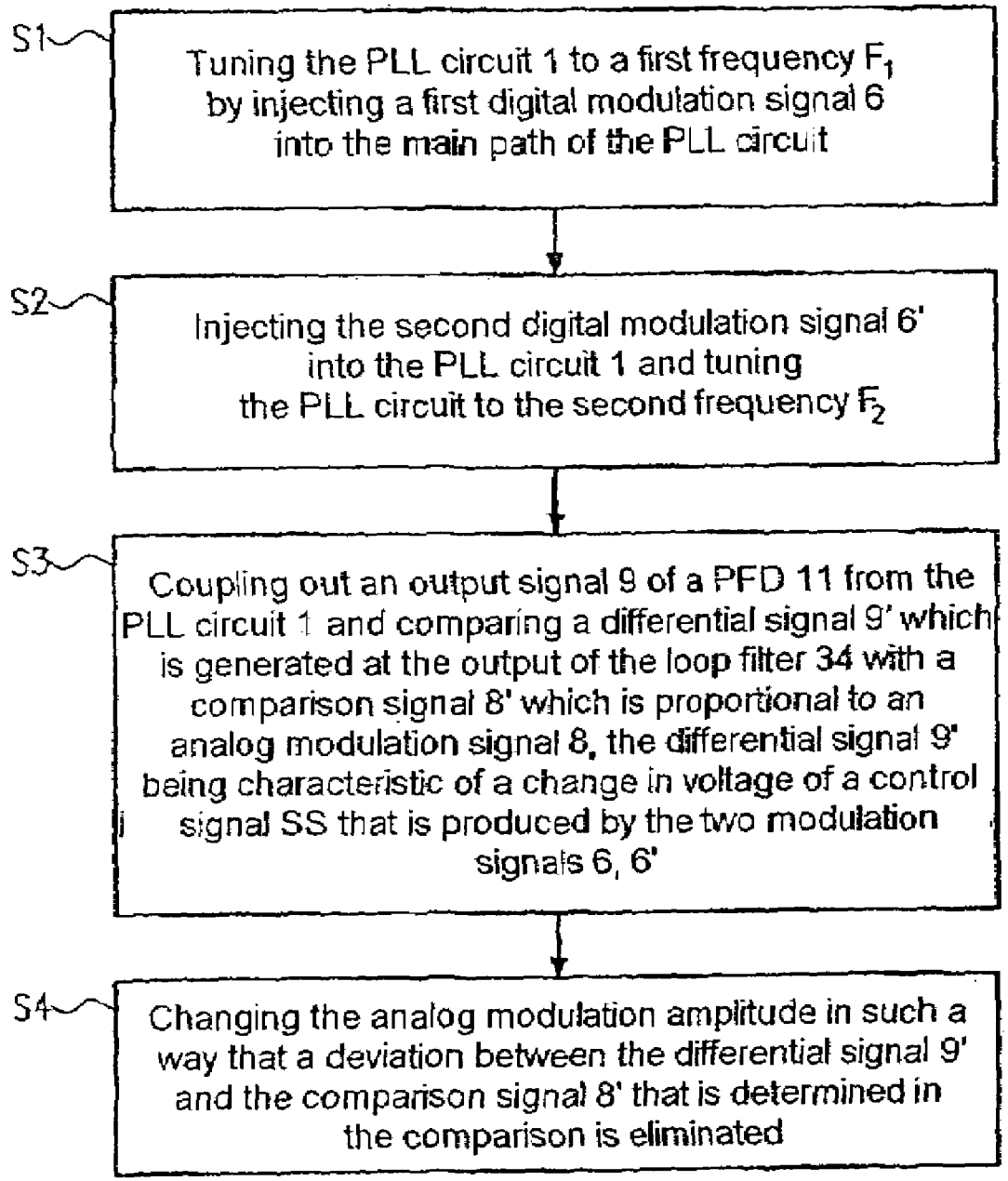
FIG. 2 shows a schematic flow diagram of the compensating method according to the invention.

In FIG. 2, a schematic flow diagram of the compensating method is presented. In the first method step S1, the PLL circuit 1 (FIG. 1) 1 is tuned to a frequency $F_1=f-\Delta f_{Dig}$, in that the first digital modulation signal 6 is injected into the main path of the PLL circuit 1. In the subsequent second method step S2, the second digital modulation signal 6' is injected into the PLL circuit 1 and the PLL circuit is tuned to the frequency $F_2=f+\Delta f_{Dig}$. An output signal 9 is coupled out from the PLL circuit 1 and a differential signal 9' is generated, said differential signal being characteristic of the change in voltage of a control signal SS at the input of the frequency-generating unit 142 that is brought about by the two digital modulation signals 6 and 6'. The differential signal 9' is compared with the comparison signal, which is proportional to the analog modulation signal 8, according to method step S3. The deviation between the differential signal 9' and the comparison signal 8' that is determined in the comparison is eliminated, in that the analog modulation amplitude is changed in a way corresponding to the method step S4.

The invention claimed is:

1. A compensating method for a PLL circuit that functions according to the principle of two-point modulation, comprising:
    (a) injecting a first digital modulation signal into the PLL circuit, the PLL circuit being tuned to a first frequency,
    (b) injecting a second digital modulation signal into the PLL circuit, the PLL circuit being tuned to a second frequency, which is different from the first frequency,
    (c) coupling out a differential signal, which is characteristic of a change of a control signal of a frequency-generating unit of the PLL circuit that is brought about by the two digital modulation signals,
    (d) comparing the differential signal with a comparison signal, which is characteristic of a modulation amplitude of an analog modulation signal, and
    (e) changing the modulation amplitude in such a way that a deviation between the differential signal and the comparison signal that is determined in the comparison is eliminated.

2. The method as claimed in claim 1, wherein the injection of the first digital modulation signal causes the PLL circuit to be tuned to the first frequency, which is formed by subtracting a frequency of a variably selectable, digital modulation amplitude from a channel center frequency.

3. The method as claimed in claim 2, wherein the injection of the second digital modulation signal causes the PLL circuit to be tuned to the second frequency, which is formed by adding the frequency of the variably selectable, digital modulation amplitude and the channel center frequency.

4. The method as claimed in claim 1, wherein a voltage value corresponding to the analog modulation amplitude is multiplied by a factor of 2 for the comparison with the voltage value corresponding to the differential signal.

5. The method as claimed in claim 1, wherein a compensating path contributing to the control signal generation is connected in parallel with a main path of the PLL circuit and further comprising:
    activating the compensating path at least during the injection of the second digital modulation signal.

6. The method as claimed in claim 5, further comprising:
    deactivating the main path of the PLL circuit after the injection of the first digital modulation signal, wherein a current generated by a first charge pump in the main path is set to the value of zero.

7. The method as claimed in claim 5, wherein the main path of the PLL circuit is kept active during the compensation and a current is set by a charge pump in the main path of the PLL circuit in such a way that the voltage at a tuning input of a VCO of the PLL circuit is kept substantially constant.

8. The method as claimed in claim 1, wherein the first digital modulation signal and the second digital modulation signal are injected via a frequency divider DIV arranged in the feedback path of the PLL circuit.

9. A PLL circuit, which is designed for the injection of an analog modulation signal and a digital modulation signal according to the principle of two-point modulation, the PLL circuit having a compensation path connected in parallel with a main path thereof, the compensating path of the PLL circuit comprising:
    a coupling-out means for generating a differential signal, which is characteristic of a change of a control signal of a frequency-generating unit of the PLL circuit when different digital modulation signals are injected into the PLL circuit,
    a comparison unit for comparing the differential signal with a comparison signal, which is characteristic of a modulation amplitude of an analog modulation signal, and
    a modulation unit, which changes the modulation amplitude of the analog modulation signal in dependence on an output signal of the comparison unit.

10. The PLL circuit as claimed in claim 9, wherein the coupling-out means comprises a charge pump and a loop filter connected downstream of the charge pump.

11. The PLL circuit as claimed in claim 9, further comprising a first switch, by means of which the differential signal is applied to a modulation input of a VCO of the PLL circuit.

12. The PLL circuit as claimed in claim 9, further comprising a second switch, in the closed position of which the comparison signal is present at an input of the comparison unit.

13. A two-point modulator, comprising:
- a PLL circuit;
- a modulation circuit in a feedback path of the PLL circuit; and
- a compensation circuit in a compensation path of the PLL circuit, wherein the compensation circuit is configured to compare a differential signal that reflects a change of a control signal associated with a frequency generating circuit within the PLL circuit with a comparison signal that reflects a modulation amplitude of an analog modulation signal, alter the modulation amplitude of the analog modulation signal based on the comparison, and provide the analog modulation signal to the PLL circuit.

14. The two-point modulator of claim 13, wherein the modulation circuit comprises a programmable modulation circuit configured to generate two different digital modulation control signals based on a digital modulation signal, and provide such signals to the PLL circuit for generation of a first frequency signal and a second frequency signal, respectively, by the frequency generating circuit.

15. The two-point modulator of claim 14, wherein the compensation circuit is configured to generate the differential signal based on the two different digital modulation control signals.

16. The two-point modulator of claim 14, further comprising a digital-to-analog converter, operable to convert a digital modulation signal to an analog modulation signal for comparison within the comparison circuit.

17. The two-point modulator of claim 13, wherein the compensation circuit is configured to alter the modulation amplitude of the analog modulation signal to substantially eliminate a deviation between the differential signal and the comparison signal.

* * * * *